(12) United States Patent
van Nugteren et al.

(10) Patent No.: US 12,131,837 B2
(45) Date of Patent: Oct. 29, 2024

(54) FLEXIBLE HTS CURRENT LEADS WITH STABILISER AND TERMINAL BLOCK

(71) Applicant: Tokamak Energy Ltd, Abingdon (GB)

(72) Inventors: Bas van Nugteren, Abingdon (GB); Greg Brittles, Abingdon (GB)

(73) Assignee: TOKAMAK ENERGY LTD, Oxfordshire (GB)

( * ) Notice: Subject to any disclaimer, the term of this patent is extended or adjusted under 35 U.S.C. 154(b) by 593 days.

(21) Appl. No.: 17/274,145

(22) PCT Filed: Aug. 30, 2019

(86) PCT No.: PCT/GB2019/052433
§ 371 (c)(1),
(2) Date: Mar. 5, 2021

(87) PCT Pub. No.: WO2020/049279
PCT Pub. Date: Mar. 12, 2020

(65) Prior Publication Data
US 2022/0084725 A1    Mar. 17, 2022

(30) Foreign Application Priority Data

Sep. 7, 2018  (GB) ........................... 1814582

(51) Int. Cl.
*H01B 12/06* (2006.01)
*H01R 4/68* (2006.01)
*H10N 60/20* (2023.01)

(52) U.S. Cl.
CPC .............. *H01B 12/06* (2013.01); *H01R 4/68* (2013.01); *H10N 60/203* (2023.02)

(58) Field of Classification Search
None
See application file for complete search history.

(56) References Cited

U.S. PATENT DOCUMENTS

| 3,767,842 | A | * | 10/1973 | Bronca | ................. | H10N 60/20 |
|   |   |   |   |   |   | 174/128.1 |
| 3,869,686 | A | * | 3/1975 | Benz | ...................... | H01F 41/04 |
|   |   |   |   |   |   | 505/880 |
| 4,329,539 | A | * | 5/1982 | Tanaka | .................. | H10N 60/80 |
|   |   |   |   |   |   | 72/286 |

(Continued)

FOREIGN PATENT DOCUMENTS

| CN | 1279827 | A | * | 1/2001 | ............... | H01R 4/68 |
| CN | 102779580 | A | * | 11/2012 | | |

(Continued)

OTHER PUBLICATIONS

Paraffin_Wax_Britannica_Wayback (Year: 2021).*

(Continued)

*Primary Examiner* — Timothy J. Dole
*Assistant Examiner* — Muhammed Azam
(74) *Attorney, Agent, or Firm* — Michael Best & Friedrich LLP

(57) ABSTRACT

A high temperature superconducting, HTS, current lead comprising an HTS cable including a plurality of HTS tapes, a braided sleeve around the HTS cable, and a stabiliser material impregnating the HTS cable and the braided sleeve, the stabiliser material having a melting point above 290K and below a thermal degradation temperature of the HTS tapes.

5 Claims, 4 Drawing Sheets

(56) References Cited

U.S. PATENT DOCUMENTS

| | | | | |
|---|---|---|---|---|
| 5,091,361 A | * | 2/1992 | Hed | F25B 21/00 |
| | | | | 62/3.1 |
| 6,034,324 A | * | 3/2000 | Dixon | H01F 6/065 |
| | | | | 505/885 |
| 7,109,151 B2 | * | 9/2006 | Lee | H10N 60/0716 |
| | | | | 505/238 |
| 7,816,303 B2 | * | 10/2010 | Thieme | H10N 60/203 |
| | | | | 428/930 |
| 8,275,429 B1 | * | 9/2012 | Pourrahimi | H01F 6/06 |
| | | | | 505/211 |
| 8,279,030 B2 | * | 10/2012 | Baker | H01F 5/06 |
| | | | | 324/319 |
| 9,620,272 B2 | * | 4/2017 | Nakayama | F25D 19/006 |
| 10,840,616 B2 | * | 11/2020 | Brittles | H10N 60/80 |
| 10,930,837 B2 | * | 2/2021 | Wilson | H01F 41/048 |
| 2002/0134574 A1 | * | 9/2002 | Hughey | H01B 12/16 |
| | | | | 505/231 |
| 2003/0000731 A1 | * | 1/2003 | Hughey | H01B 12/06 |
| | | | | 174/125.1 |
| 2003/0183410 A1 | * | 10/2003 | Sinha | H01B 12/06 |
| | | | | 174/68.1 |
| 2005/0173149 A1 | | 8/2005 | Gouge et al. | |
| 2008/0194411 A1 | | 8/2008 | Folts et al. | |
| 2012/0309631 A1 | * | 12/2012 | Arndt | H01F 6/065 |
| | | | | 335/216 |
| 2013/0244881 A1 | * | 9/2013 | Roden | H01B 12/16 |
| | | | | 174/15.5 |
| 2016/0049225 A1 | * | 2/2016 | Mcintyre | H01B 12/06 |
| | | | | 505/231 |
| 2016/0240284 A1 | * | 8/2016 | Tosaka | H02G 15/34 |
| 2016/0240286 A1 | | 8/2016 | Iwasa et al. | |
| 2021/0210672 A1 | * | 7/2021 | Lau | H01F 6/06 |
| 2022/0005614 A1 | * | 1/2022 | Sorbom | G21B 1/11 |
| 2022/0084725 A1 | * | 3/2022 | Van Nugteren | H10N 60/203 |

FOREIGN PATENT DOCUMENTS

| | | | | | |
|---|---|---|---|---|---|
| CN | 103718382 A | * | 4/2014 | | H01B 12/02 |
| CN | 105637592 A | * | 6/2016 | | G21B 1/05 |
| CN | 109854825 A | * | 6/2019 | | |
| CN | 218159772 U | * | 12/2022 | | |
| EP | 1455367 A1 | * | 9/2004 | | H01B 12/02 |
| EP | 1489693 A1 | * | 12/2004 | | H01B 12/02 |
| EP | 2587493 A1 | | 5/2013 | | |
| EP | 2806430 A1 | | 11/2014 | | |
| ES | 2399842 T3 | * | 4/2013 | | B63G 9/06 |
| JP | S63274016 A | | 11/1988 | | |
| JP | H0752799 B2 | * | 6/1995 | | |
| JP | H08106824 A | | 4/1996 | | |
| JP | H08106825 A | | 4/1996 | | |
| JP | H10188691 A | * | 7/1998 | | |
| JP | H10188692 A | * | 7/1998 | | |
| JP | H11260162 A | * | 9/1999 | | |
| JP | 2003331660 A | | 11/2003 | | |
| JP | 2008117734 A | * | 5/2008 | | |
| JP | 2008234957 A | * | 10/2008 | | |
| JP | 2009503794 A | | 1/2009 | | |
| JP | 2010518582 A | | 5/2010 | | |
| JP | 2011171090 A | * | 9/2011 | | |
| JP | 2011176018 A | * | 9/2011 | | |
| JP | 2013073831 A | | 4/2013 | | |
| JP | 2015162427 A | | 9/2015 | | |
| JP | 2015211009 A | | 11/2015 | | |
| JP | 2016009721 A | * | 1/2016 | | |
| JP | 2017175031 A | * | 9/2017 | | |
| JP | 2017204333 A | * | 11/2017 | | |
| JP | 2018092941 A | | 6/2018 | | |
| JP | 2018137292 A | | 8/2018 | | |
| JP | 2019102298 A | * | 6/2019 | | |
| KR | 101225658 B1 | | 1/2013 | | |
| KR | 20160046611 A | * | 4/2019 | | |
| WO | WO-0108171 A1 | * | 2/2001 | | H02G 15/34 |
| WO | WO-2008015941 A1 | * | 2/2008 | | H01L 39/248 |
| WO | WO-2015187253 A2 | * | 12/2015 | | B23K 1/0016 |

OTHER PUBLICATIONS

International Search Report and Written Opinion for Application No. PCT/GB2019/052433 dated Nov. 27, 2019 (11 pages).

International Preliminary Report on Patentability for Application No. PCT/GB2019/052433 dated Nov. 19, 2020 (13 pages).

Written Opinion of the International Preliminary Examining Authority for Application No. PCT/GB2019/052433 dated Sep. 2, 2020 (6 pages).

United Kingdom Intellectual Property Office Search Report for Application No. GB1814582.1 dated Jan. 11, 2019 (3 pages).

Japanese Patent Office Action for Application No. 2021-512946 dated Oct. 17, 2023 (9 pages including English translation).

English Translation of Korean Intellectual Property Office Notice of Non-Final Rejection for Application No. 10-2021-7010235 dated Mar. 14, 2024 (4 pages).

* cited by examiner

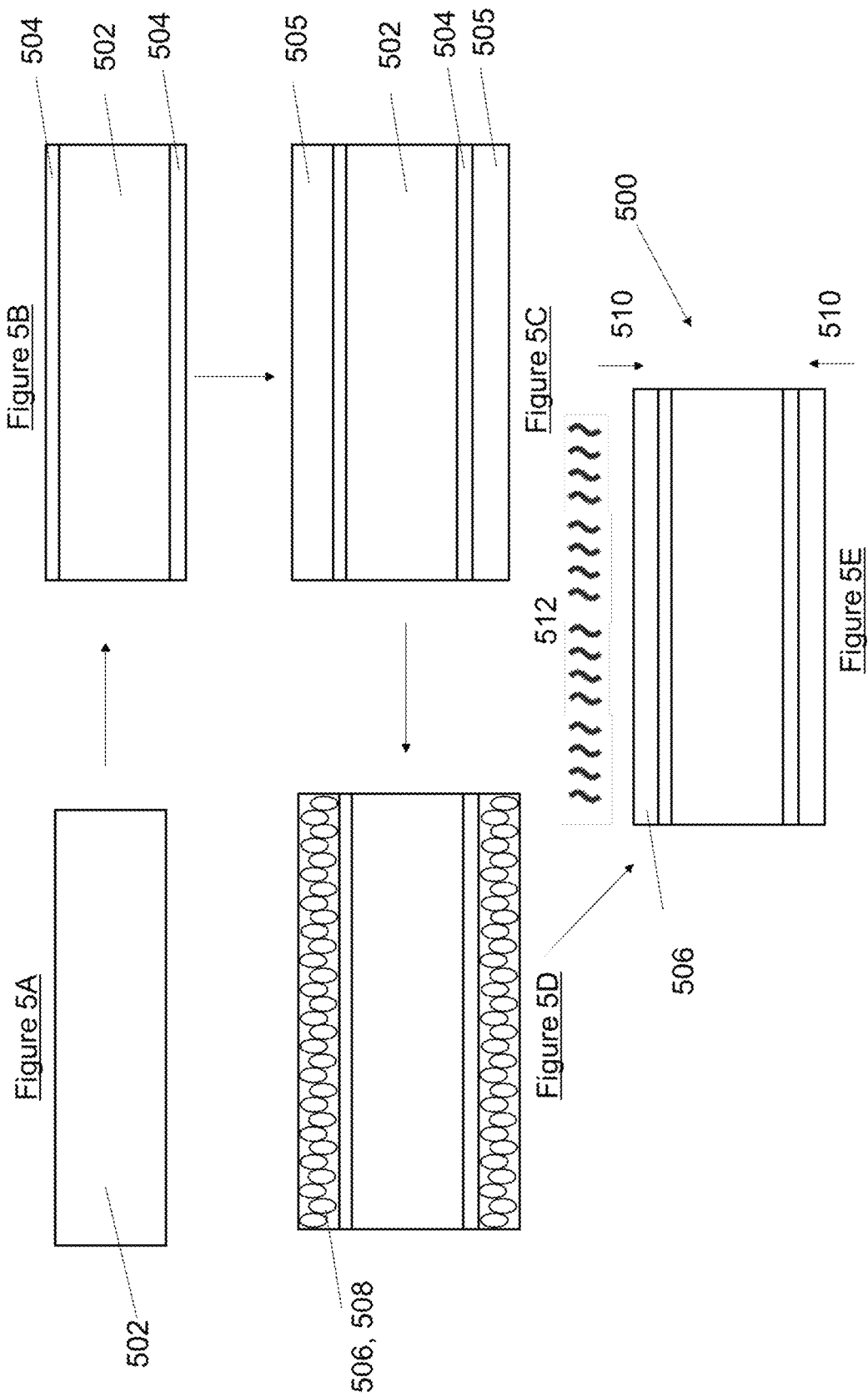

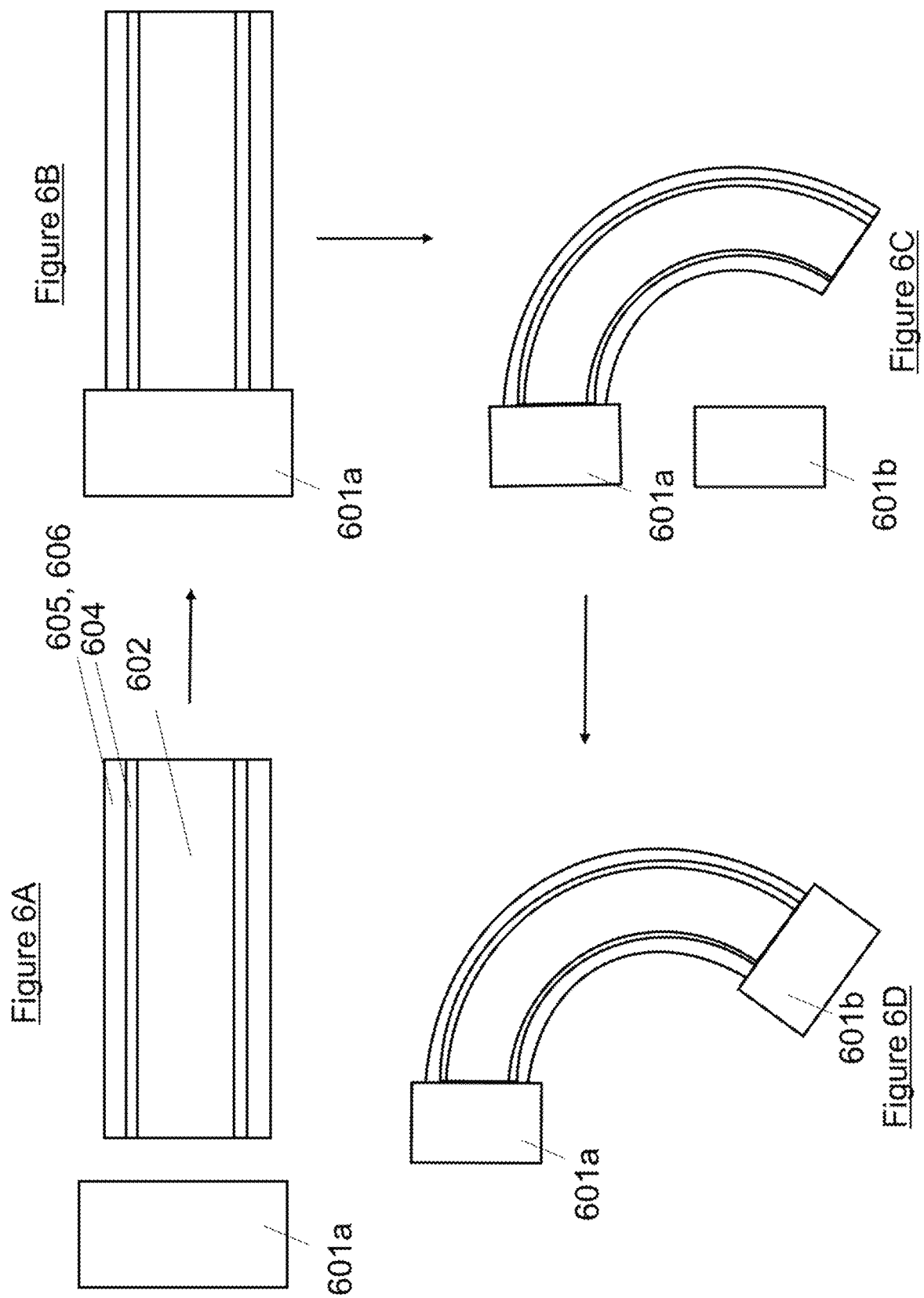

FLEXIBLE HTS CURRENT LEADS WITH STABILISER AND TERMINAL BLOCK

CROSS-REFERENCE TO RELATED APPLICATIONS

This application claims is a national phase application of international application PCT/GB2019/052433 filed Aug. 30, 2019, which claims the benefit of GB1814582.1, filed on Sep. 7, 2018, the entire contents of each are incorporated by reference herein.

FIELD OF THE INVENTION

The present invention relates to superconductor devices. In particular, the present invention relates to current leads comprising high temperature superconductor.

BACKGROUND

Superconducting materials are typically divided into "high temperature superconductors" (HTS) and "low temperature superconductors" (LTS). LTS materials, such as Nb and NbTi, are metals or metal alloys whose superconductivity can be described by BCS theory. All low temperature superconductors have a critical temperature (the temperature above which the material cannot be superconducting even in zero magnetic field) below about 30K. The behaviour of HTS material is not described by BCS theory, and such materials may have critical temperatures above about 30K (though it should be noted that it is the physical differences in superconducting operation and composition, rather than the critical temperature, which define HTS material). The most commonly used HTS are "cuprate superconductors"—ceramics based on cuprates (compounds containing a copper oxide group), such as BSCCO, or ReBCO (where Re is a rare earth element, commonly Y or Gd). Other HTS materials include iron pnictides (e.g. FeAs and FeSe) and magnesium diborate ($MgB_2$).

ReBCO is typically manufactured as tapes, with a structure as shown in FIG. 1. Such tape 100 is generally approximately 100 microns thick, and includes a substrate 101 (typically electropolished hastelloy approximately 50 microns thick), on which is deposited by IBAD, magnetron sputtering, or another suitable technique a series of buffer layers known as the buffer stack 102, of approximate thickness 0.2 microns. An epitaxial ReBCO-HTS layer 103 (deposited by MOCVD or another suitable technique) overlays 15 the buffer stack, and is typically 1 micron thick. A 1-2 micron silver layer 104 is deposited on the HTS layer by sputtering or another suitable technique, and a copper stabilizer layer 105 is deposited on the tape by electroplating or another suitable technique, which often completely encapsulates the tape.

The substrate 101 provides a mechanical backbone that can be fed through the manufacturing line and permit growth of subsequent layers. The buffer stack 102 is required to provide a biaxially textured crystalline template upon which to grow the HTS layer, and prevents chemical diffusion of elements from the substrate to the HTS which damage its superconducting properties. The silver layer 104 is required to provide a low resistance interface from the ReBCO to the stabiliser layer, and the stabiliser layer 105 provides an alternative current path in the event that any part of the ReBCO ceases superconducting (enters the "normal" state).

A common issue in the design of superconducting systems such as magnets is to obtain high currents at cryogenic temperatures with minimal heat load to the cryogenic environment. Usually, a high current is generated at room temperature (i.e. outside of the cryogenic environment), and transported into the cryostat by current leads. The current leads are typically a mix of copper (for temperatures around 300K), brass (for temperatures between 300K and 77K), and high temperature superconductors (HTS) (for temperatures below 77K). Current leads may also be used to transport current in regions of the system at a single temperature.

Other solutions may be used, e.g. having a switched mode power supply which transfers power into the cryostat, but these will generally still involve HTS current leads between the power supply and the superconducting system.

HTS current leads may be either rigid or flexible. Rigid leads may cause mechanical issues due to thermal shrinkage when the cryostat is cooled. Flexible leads must be handled carefully, as HTS tape will develop cracks if it is bent with too small a radius, and will have reduced critical current if it is under strain due to bending while operational.

SUMMARY

According to a first aspect, there is provide an HTS current lead. The HTS current lead comprises an HTS cable comprising a plurality of HTS tapes; a braided sleeve around the HTS cable; and a stabiliser material impregnating the HTS cable and the braided sleeve. The stabiliser material has a melting point above a critical temperature of the HTS tapes and below a thermal degradation temperature of the HTS tapes.

According to a second aspect, there is provided a method of manufacturing an HTS current lead. An HTS cable is provided, comprising a plurality of HTS tapes. A braided sleeve is placed around the cable. A leak-tight sheath is placed around the braided sleeve. The leak-tight sheath is filled with a stabiliser material, the stabiliser material having a melting point above a critical temperature of the HTS tapes and below a thermal degradation temperature of the HTS tapes. The leak-tight sheath is filled.

According to a third aspect, there is provided a method of reshaping an HTS current lead according to the first aspect and additionally comprising a leak tight sheath around the stabiliser material. The HTS current lead is heated to a temperature above the meting point of the stabiliser material and below the degradation temperature of the HTS tape. The HTS current lead is bent into a desired shape. The HTS current lead is allowed to cool while maintaining it in the desired shape.

BRIEF DESCRIPTION OF THE DRAWINGS

FIG. 5A to 5E are schematic diagrams, showing a method of manufacturing an HTS current lead.

FIG. 6A to 6D are schematic diagrams, showing method steps for affixing a first and a second terminal block to an HTS cable.

DETAILED DESCRIPTION

Figure 1:
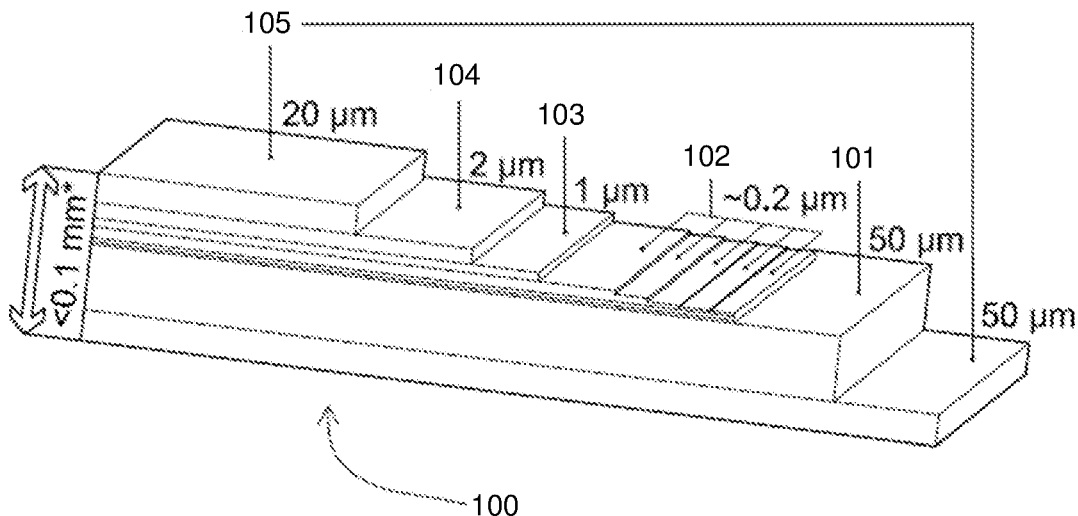
FIG. 1 is a schematic diagram of an HTS tape.
Figure 2:
FIG. 2 is a schematic diagram of an exemplary construction of an HTS current lead.

A construction for an HTS current lead is shown in FIG. 2. The HTS current lead comprises a plurality of HTS tapes 201, which are held within a braided sleeve 202. The tapes 201 and braided sleeve 202 are encased in wax 203, which is held in place by a sheath 204.

The HTS tapes may be stacked (i.e. all parallel) or arranged into a cable in some other orientation (e.g. twisted stacks or braided cables).

The braided sleeve acts to make the current lead bulkier, which means that it is much more difficult to bend the current lead with a bending radius which would cause damage to the tapes, as compared to bending the cable alone. The braided sleeve may comprise metal in order to also act as an electrical "stabiliser" for the HTS tapes, i.e. as an alternative current path in the event that the current through the HTS tapes exceeds the critical current. Suitable metals for the braided sleeve include brass or copper, and the metal filaments may be coated with another metal such as PbSn solder.

The braided sleeve may be configured to entirely prevent bending below a certain radius of curvature.

The wax acts to keep the current lead structurally stable during handling of the system and during operation of the superconducting system. The current lead may be heated up to melt the wax, so that it can be bent into a desired shape, and then allowed to cool to retain that shape. Suitable waxes will have a melting point above an intended operating temperature of the current lead (e.g. 77K, or the critical temperature of the HTS tapes), or above room temperature (290K, to ensure they are stable at room temperature), but below a degradation temperature of the HTS (i.e. a temperature at which permanent damage to the HTS would occur, usually around 200° C.). If the melting point of the braided sleeve, sheath, or any solder in the HTS current lead is below the HTS degradation temperature, then the melting point of the wax may be below this as well—or heat may be applied in such a way as to prevent the lower melting point components from reaching the same temperature as the wax (e.g. avoiding soldered areas).

While wax is used herein as an example, other substances with a melting point above room temperature and below the HTS degradation temperature would also be suitable for use as stabiliser materials to impregnate the HTS current lead.

The properties of the wax during cryogenic cooling may also be considered—some waxes will break down into powder if cooled to cryogenic temperatures and warmed back to room temperature, and would not be suitable for applications where cycles of cooling and warming are expected (but would be suitable for devices kept at cryogenic temperatures permanently). Which waxes perform well at cryogenic temperatures can be determined by routine experimentation.

The rigidity of the wax at room temperature and at cryogenic temperatures will also be a consideration, depending on the design constraints of the system. More rigid waxes will offer better structural protection during operation (e.g. against Lorentz forces), but may suffer from mechanical issues due to thermal shrinkage. More flexible waxes will offer less protection from Lorentz forces, but will be able to flex more easily to account for thermal shrinkage.

One wax which satisfies the above conditions is beeswax (melting temperature of 60° C., and stable through cryogenic cycles). Where "wax" is used herein, this may also be a mixture of different waxes or other materials to achieve the desired properties.

The sheath 204 may be a heat-shrink material, such that when the wax is heated in order to reshape the cable, the heat shrink material will shrink to encourage the wax to fill any voids in the structure. Once the HTS current lead has been shaped into position and the wax has solidified, the sheath 204 may be removed if desired, or kept on for additional electrical insulation.

Many materials which would be otherwise suitable to provide a leak-tight sheath will become brittle at cryogenic temperatures. Therefore, the sheath 204 may comprise a first "room temperature" sheath, which is leak-tight at room temperature and at the temperature required to melt the wax, and a second "cryogenic" sheath surrounding the "room temperature" sheath, which maintains structural integrity at cryogenic temperatures.

Figure 3:
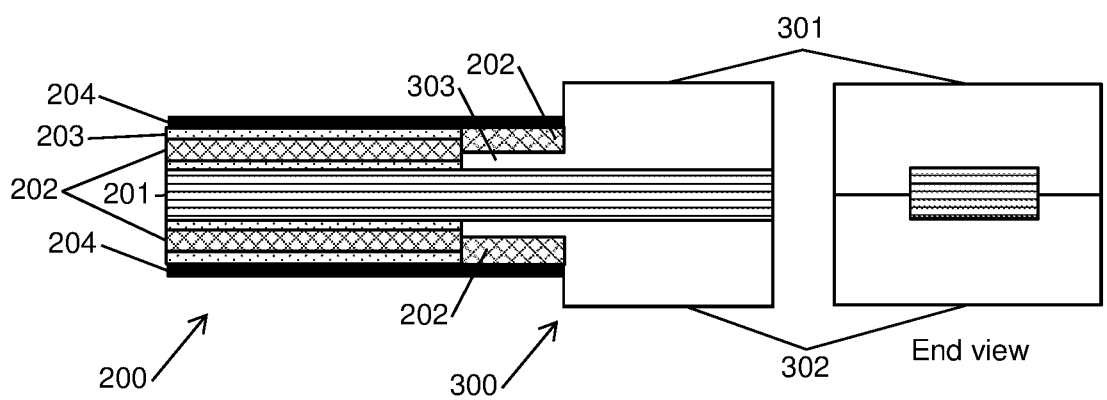
FIG. 3 is a schematic diagram of an exemplary construction of an HTS current lead comprising terminals.

FIG. 3 is a schematic illustration of the connection between an HTS current lead according to FIG. 2, and a terminal block. The terminal block may be used to connect the HTS current lead electrically, thermally, and structurally to other components.

The HTS current lead 200 has the same components as previously—i.e. the HTS tapes 201, braided sleeve 202, wax 203, and sheath 204. The HTS tapes 201 extend beyond the braided sleeve 202 and into the terminal block 300. Additional copper tapes may be placed between the HTS tapes such that they are spaced out further within the terminal block, and provided with additional copper in case of excess current—the terminal block is likely to undergo resistive heating, which will lower the critical current of the tapes and result in a greater risk of quenching, and the excess copper helps mitigate this.

The terminal block may be formed from upper 301 and lower 302 portions, which the HTS tapes are clamped between. Alternatively, the terminal block may be formed as a single unit having a recess or through hole to receive the HTS tapes. Other suitable constructions may also be used. The recess or through hole in the terminal block (or the space between the two portions in the clamped example) may fit the HTS tapes to within 0.1 mm to allow them to be easily soldered to the terminal block.

The braided sleeve 202 surrounds a protrusion 303 on the side of the terminal block, and the sheath 204 also extends around this protrusion. The braided sleeve 202, HTS tapes 201, and terminal block 300 may be connected by soldering, e.g. by dipping the entire block and the protrusions in solder (keeping the sheath 204 and wax 203 away from the hot solder). The solder should be chosen to have a melting point below the degradation temperature of the HTS. Sealant may be applied to be join between the terminal block and the sheath 204.

The HTS current lead, including terminal blocks may be manufactured by the following steps:

1. HTS tapes are cut to length, and assembled into a cable (e.g. by stacking).
2. A first terminal block is placed over one end of the cable.
3. The braided sleeve is cut to the desired length and slid over the cable, up to the first terminal block and around the protrusion.
4. The first terminal block is dipped in solder to fix the HTS cable and braided sleeve to each other and to the first terminal block.
5. The sheath is slid over the braided sleeve, and sealed at the end adjacent to the first terminal block.
6. The sheath is filled with wax, and temporarily fixed at the end furthest from the first terminal block, such that that end is held some way away from where the second terminal block will be attached.
7. The second terminal block is placed over the free cable end, and the braided sleeve is slid over the protrusion of second terminal block.

8. The second terminal block is dipped in solder to fix the HTS cable and braided sleeve to each other and the second terminal block.
9. The sheath is slid down to second terminal block, and sealed at that end.
10. The assembly is heated to melt the wax (and shrink the heat-shrink material, if that is used for the sheath).

These steps may be varied appropriately for terminals other than the terminal blocks described with reference to FIG. 3. In general, forming the HTS current lead will require the steps of:

1. Providing an HTS cable comprising a plurality of tapes.
2. Placing a braided sleeve around the cable.
3. Placing a sheath around the braided sleeve.
4. Filling the sheath with wax (either molten or in the form of pellets).
5. Sealing the sheath.
6. Melting the wax if pellets were used.

These steps may be re-ordered or broken up into sub-steps as required to connect the HTS cable to the terminals used.

Where HTS cables comprising stacked tapes are used (and potentially for other cable designs), the relative orientations of the terminal blocks will be limited to close to their orientation when the cable is made (e.g. if the terminal blocks are parallel, then they will remain close to parallel as the HTS current lead is bent). This is because significantly changing the relative orientations of the terminal blocks would require HTS tapes on one side of the stack to extend relative to HTS tapes on the other side of the stack. This can be mitigated by pre-bending the stacked HTS cable prior to affixing the second terminal block, so that the terminal blocks are in the desired relative orientation.

Figure 4:
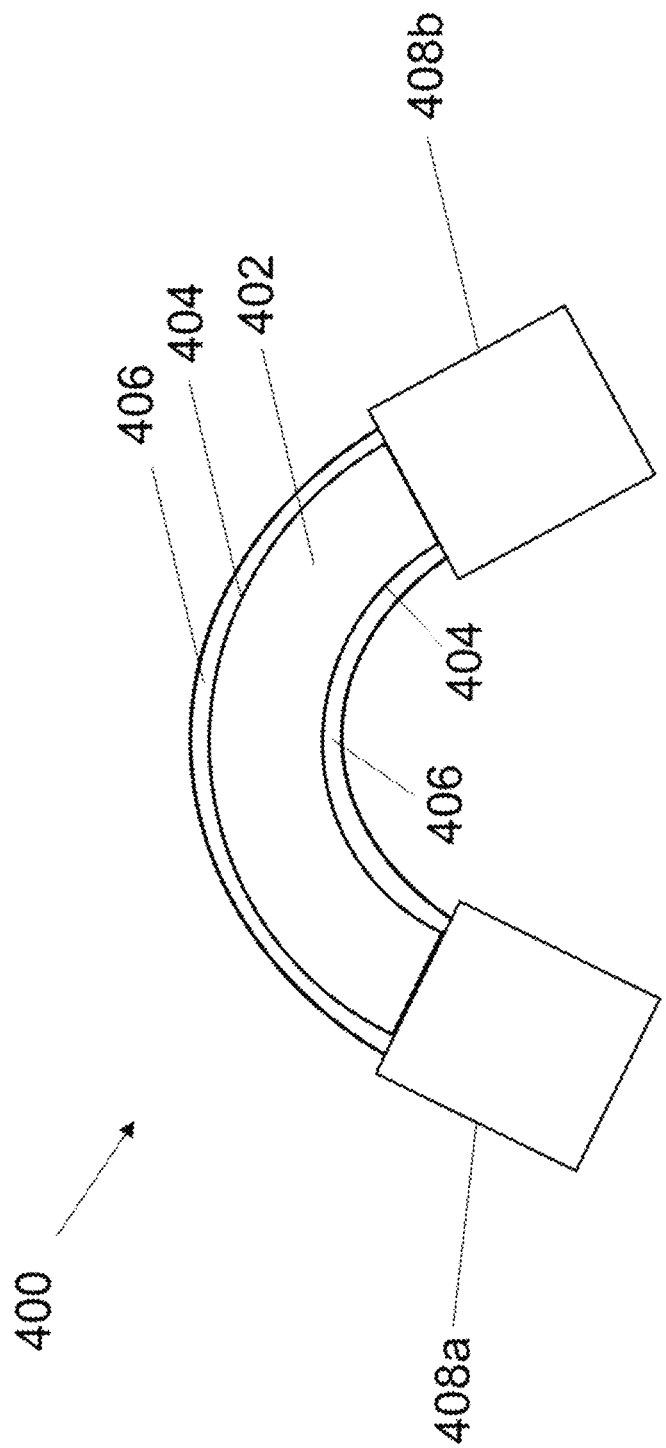
FIG. 4 is a schematic diagram of an HTS current lead.

FIG. 4 is a schematic diagram of an HTS current lead 400. The HTS current lead comprises an HTS cable 402 including a plurality of HTS tapes and a braided sleeve 404 around the HTS cable. A stabiliser material 406, with a melting point above 290K but below a thermal degradation temperature of the HTS tapes, impregnates the HTS cable and the braided sleeve. The HTS cable is bent and the terminal blocks 408a, 408b at each end of the HTS cable are at an angle to each other. Each terminal block is electrically connected to the HTS tape and configured for electrical connection to external components (not shown).

FIG. 5A to 5E are schematic diagrams, showing a method of manufacturing an HTS current lead 500. In FIG. 5A, an HTS cable 502, including a plurality of HTS tapes, is provided. In FIG. 5B, a braided sleeve 504 is placed around the cable. In FIG. 5C, a leak-tight sheath 505 is placed around the braided sleeve. In FIG. 5D, the leak-tight sheath is filled with a stabiliser material 506, having a melting point above 290K and below a thermal degradation temperature of the HTS tapes. As shown, this may include inserting pellets 508 of the stabiliser material into the leak-tight sheath. The pellets may then be melted. The method also includes sealing the leak-tight sheath. The leak-tight sheath may be formed from a heat shrink material. As shown in FIG. 5E, the leak-tight sheath may be heated 510, following the step of filling the leak-right sheath with stabiliser material, to melt the stabiliser material and to shrink (denoted by arrows 512) the sheath.

FIG. 6A to 6D are schematic diagrams, showing method steps for affixing a first and a second terminal block 601a, 601b to an HTS cable. In FIG. 6A, an HTS cable 602, including a plurality of HTS tapes, is provided. A braided sleeve 604 is placed around the cable, and a leak-tight sheath 605 is placed around the braided sleeve. A stabiliser material 606, having a melting point above 290K but below a thermal degradation temperature of the HTS tapes, fills the leak-tight sheath. The leak-tight sheath is sealed. In FIG. 6B, the first terminal block 601a is affixed to the HTS cable at one end. In FIG. 6C, the HTS cable is bent. In FIG. 6D, the second terminal 601b block is affixed to the HTS cable at the other end, while the HTS cable is bent, such that the first and second terminal blocks are at an angle relative to one another.

The invention claimed is:

1. A high temperature superconducting, HTS, current lead comprising:
    an HTS cable including a plurality of HTS tapes;
    a braided sleeve around the HTS cable;
    a stabiliser material impregnating the HTS cable and the braided sleeve, the stabiliser material having a melting point above 290K and below a thermal degradation temperature of the HTS tapes; and
    a terminal block at each end of the HTS cable, each terminal block being electrically connected to the HTS tape, and being configured for electrical connection to external components,
    wherein, the HTS cable is bent and the terminal blocks are at an angle to each other.

2. A method of manufacturing an HTS current lead, the method comprising:
    providing an HTS cable including a plurality of HTS tapes;
    placing a braided sleeve around the cable;
    placing a leak-tight sheath around the braided sleeve;
    filling the leak-tight sheath with a stabiliser material, the stabiliser material having a melting point above 290K and below a thermal degradation temperature of the HTS tapes; and
    sealing the leak-tight sheath,
    wherein the step of filling the leak-tight sheath with stabiliser material includes:
        inserting pellets of the stabiliser material into the leak-tight sheath;
        melting the pellets.

3. A method of reshaping an HTS current lead, comprising:
    providing an HTS cable including a plurality of HTS tapes,
        a braided sleeve around the HTS cable,
        a stabiliser material impregnating the HTS cable and the braided sleeve, the stabiliser material having a melting point above a critical temperature of the HTS tape and below a thermal degradation temperature of the HTS tapes, and
        a leak-tight sheath encapsulating the stabiliser material;
    heating the HTS current lead to a temperature above the melting point of the stabiliser material and below the degradation temperature of the HTS tape;
    bending the HTS current lead into a desired shape; and
    allowing the HTS current lead to cool while maintaining it in the desired shape.

4. A method of manufacturing an HTS current lead, the method comprising:
    providing an HTS cable including a plurality of HTS tapes;
    placing a braided sleeve around the cable;
    placing a leak-tight sheath around the braided sleeve;
    filling the leak-tight sheath with a stabiliser material, the stabiliser material having a melting point above 290K and below a thermal degradation temperature of the HTS tapes; and
    sealing the leak-tight sheath, wherein, the leak-tight sheath is formed from a heat shrink material, and the method further comprises heating the leak-tight sheath following the step of filling the leak-tight sheath with stabiliser material in order to melt the stabiliser material and shrink the sheath.

5. A method of manufacturing an HTS current lead, the method comprising:
provide an HTS cable including a plurality of HTS tapes;
placing a braided sleeve around the cable;
placing a leak-tight sheath around the braided sleeve;
filling the leak-tight sheath with a stabiliser material, the stabiliser material having a melting point above 290K and below a thermal degradation temperature of the HTS tapes;
sealing the leak-tight sheath;
affixing the HTS cable to a first terminal block at one end;
bending the HTS cable; and
affixing the HTS cable to a second terminal block at the other end, while the HTS cable is bent, such that the first and second terminal blocks are at an angle relative to each other.

* * * * *